US011302741B2

(12) United States Patent
Mittra et al.

(10) Patent No.: US 11,302,741 B2
(45) Date of Patent: Apr. 12, 2022

(54) IMAGE SENSOR STRUCTURE AND METHOD OF FORMING THE SAME

(71) Applicant: Himax Imaging Limited, Tainan (TW)

(72) Inventors: Amit Mittra, Tainan (TW); Yang Wu, Tainan (TW); Ki-Hong Kim, Tainan (TW)

(73) Assignee: Himax Imaging Limited, Tainan (TW)

( * ) Notice: Subject to any disclaimer, the term of this patent is extended or adjusted under 35 U.S.C. 154(b) by 186 days.

(21) Appl. No.: 16/779,655

(22) Filed: Feb. 2, 2020

(65) Prior Publication Data

US 2021/0242274 A1    Aug. 5, 2021

(51) Int. Cl.
  *H01L 27/146* (2006.01)

(52) U.S. Cl.
  CPC .. *H01L 27/14685* (2013.01); *H01L 27/14605* (2013.01); *H01L 27/14621* (2013.01); *H01L 27/14627* (2013.01); *H01L 27/14643* (2013.01)

(58) Field of Classification Search
  None
  See application file for complete search history.

(56) References Cited

U.S. PATENT DOCUMENTS

| | | | |
|---|---|---|---|
| 9,425,227 B1 * | 8/2016 | Wang | H01L 27/14649 |
| 9,917,134 B1 * | 3/2018 | Hsieh | H01L 27/14649 |
| 10,163,974 B2 | 12/2018 | Su et al. | |
| 2016/0099280 A1 * | 4/2016 | Huang | H01L 27/14645 |
| | | | 250/208.1 |
| 2016/0191822 A1 * | 6/2016 | Kosugou | H04N 5/23245 |
| | | | 382/118 |
| 2017/0187948 A1 * | 6/2017 | Wang | G02B 7/32 |
| 2018/0076242 A1 * | 3/2018 | Hsieh | H01L 27/14621 |
| 2018/0277581 A1 * | 9/2018 | Kim | H01L 27/14621 |
| 2019/0310401 A1 * | 10/2019 | Park | G02B 5/208 |

FOREIGN PATENT DOCUMENTS

| | | |
|---|---|---|
| CN | 109841641 A | 6/2019 |
| TW | 201627461 A | 8/2016 |

OTHER PUBLICATIONS

Yokogawa, Sozo et al., "IR sensitivity enhancement of CMOS Image Sensor with diffractive light trapping pixels", Scientific Reports, 7:3832, pp. 1-9 (2017).

* cited by examiner

*Primary Examiner* — Ali Naraghi
(74) *Attorney, Agent, or Firm* — CKC & Partners Co., LLC (57) ABSTRACT

An image sensor structure has a visible light detection region and an infrared light detection region neighboring the visible light detection region. The image sensor structure includes a semiconductor substrate, photo sensing members, an infrared absorption enhancing member, a color filter and an infrared pass filter. The semiconductor substrate has a front side and a back side opposite to each other. The first photo sensing member is disposed in the front side of the semiconductor substrate. The infrared absorption enhancing member is in the back side of the semiconductor substrate and only in the infrared light detection region. The color filter is over the back side of the semiconductor substrate and in the visible light detection region. The infrared pass filter is over the infrared absorption enhancing member.

18 Claims, 13 Drawing Sheets

IMAGE SENSOR STRUCTURE AND METHOD OF FORMING THE SAME

BACKGROUND

Field of the Invention

The invention relates to an image sensor, and more particularly to an image sensor structure which includes infrared detection function and a method of forming the same.

Description of Related Art

Image sensors have been widely used in various imaging applications and products, such as smart phones, digital cameras, scanners, etc. Furthermore, an image sensor with infrared detection function can detect infrared light as well as visible light, in order to obtain more information. With its capability of detecting infrared light, the image sensor with infrared detection function are applied for security applications, such as iris recognition, object detection, and the like.

SUMMARY

One aspect of the invention directs to an image sensor structure which has a visible light detection region and an infrared light detection region neighboring the visible light detection region. The image sensor structure includes a semiconductor substrate, photo sensing members, at least one infrared absorption enhancing member, a color filter and an infrared pass filter. The semiconductor substrate has a front side and a back side opposite to each other. The photo sensing members are disposed in the front side of the semiconductor substrate. The infrared absorption enhancing member is in the back side of the semiconductor substrate and only in the infrared light detection region. The color filter is over the back side of the semiconductor substrate and in the visible light detection region. The infrared pass filter is over the infrared absorption enhancing member.

In accordance with one or more embodiments of the invention, the image sensor structure further includes an infrared notch filter that is over the back side of the substrate and in the visible light detection region.

In accordance with one or more embodiments of the invention, the infrared notch filter is interposed between the semiconductor substrate and the color filter.

In accordance with one or more embodiments of the invention, the image sensor structure further includes microlenses that are respectively over the color filter and the infrared pass filter.

In accordance with one or more embodiments of the invention, the infrared pass filter has a wavelength pass band in a range from 700 nm to 1100 nm.

In accordance with one or more embodiments of the invention, the wavelength pass band of the infrared pass filter has a center pass wavelength of about 850 nm.

In accordance with one or more embodiments of the invention, the wavelength pass band of the infrared pass filter has a center pass wavelength of about 940 nm.

In accordance with one or more embodiments of the invention, the image sensor structure further includes a device layer and a carrier substrate. The device layer is over the front side of the semiconductor substrate. The carrier substrate is over the device layer.

In accordance with one or more embodiments of the invention, the infrared absorption enhancing member includes silicon dioxide.

Another aspect of the invention is directed to a method of forming an image sensor structure with a visible light detection region and an infrared light detection region neighboring the visible light detection region. The method includes the following steps. A semiconductor substrate is provided, which has a front side and a back side opposite to each other. Photo sensing members are formed in the front side of the semiconductor substrate. At least one infrared absorption enhancing member is formed in the back side of the semiconductor substrate and only in the infrared light detection region. A color filter is formed over the back side of the semiconductor substrate. An infrared pass filter is formed over the infrared absorption enhancing member.

In accordance with one or more embodiments of the invention, the method further includes forming an infrared notch filter over the back side of the semiconductor substrate and in the visible light detection region.

In accordance with one or more embodiments of the invention, the color filter is formed over the infrared notch filter.

In accordance with one or more embodiments of the invention, the method further includes forming microlenses respectively over the color filter and the infrared pass filter.

In accordance with one or more embodiments of the invention, the infrared pass filter is formed having a wavelength pass band in a range from 700 nm to 1100 nm.

In accordance with one or more embodiments of the invention, the wavelength pass band of the infrared pass filter has a center pass wavelength of about 850 nm.

In accordance with one or more embodiments of the invention, the wavelength pass band of the infrared pass filter has a center pass wavelength of about 940 nm.

In accordance with one or more embodiments of the invention, the method further includes forming a device layer over the front side of the semiconductor substrate and forming a carrier substrate over the device layer.

In accordance with one or more embodiments of the invention, the infrared absorption enhancing member is formed of silicon dioxide.

BRIEF DESCRIPTION OF THE DRAWINGS

The foregoing aspects and many of the accompanying advantages of this invention will become more readily appreciated as the same becomes better understood by reference to the following detailed description, when taken in conjunction with the accompanying drawings.

DETAILED DESCRIPTION

The detailed explanation of the invention is described as following. The described preferred embodiments are presented for purposes of illustrations and description, and they are not intended to limit the scope of the invention.

Terms used herein are only used to describe the specific embodiments, which are not used to limit the claims appended herewith. Unless limited otherwise, the term "a," "an," "one" or "the" of the single form may also represent the plural form. Further, the spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The document may repeat reference numerals and/or letters in the various examples. This repetition is for the purpose of simplicity and clarity and does not in itself dictate a relationship between the various embodiments and/or configurations discussed.

Figure 1:
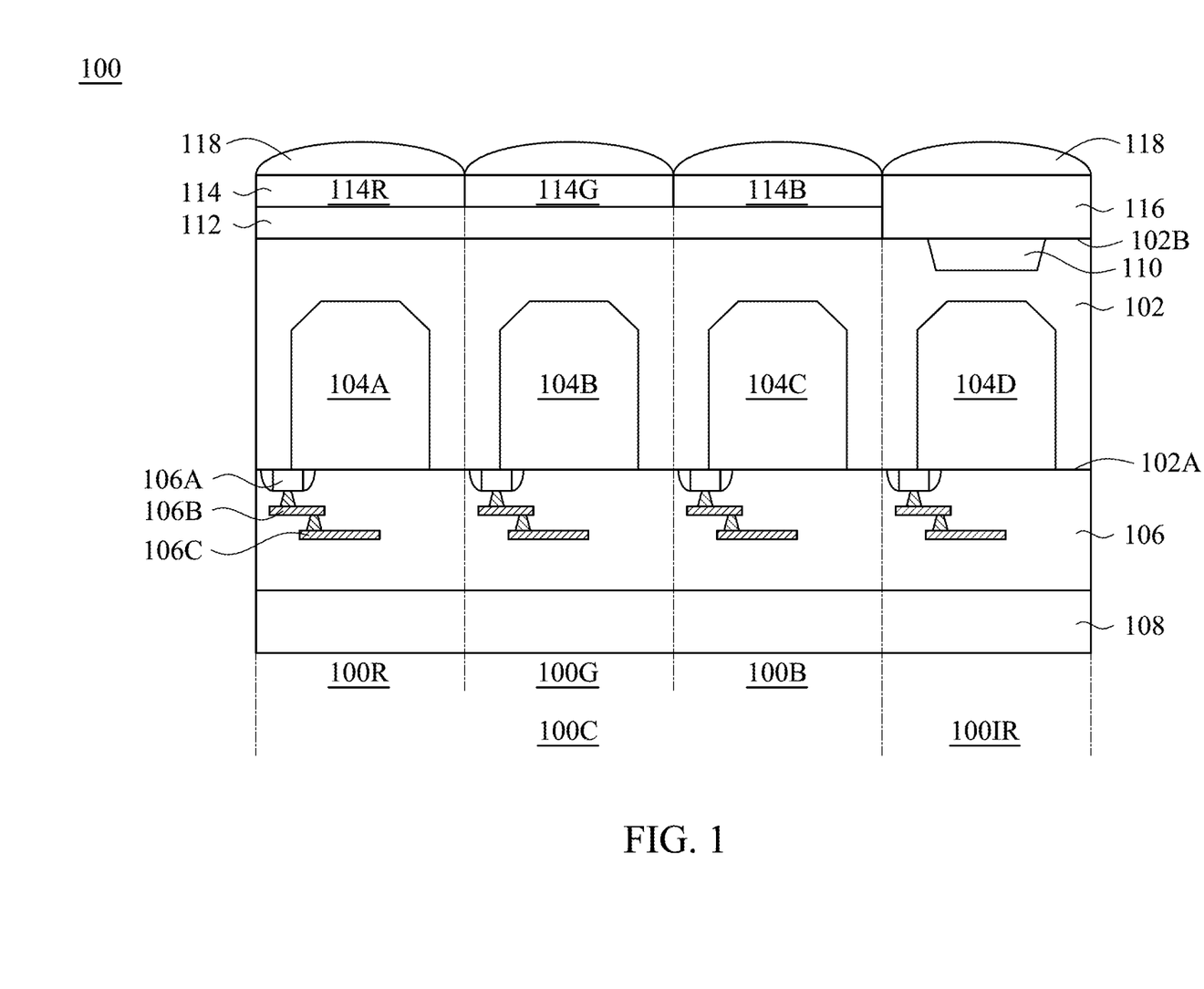
FIG. 1 illustrates a cross sectional view of an image sensor structure in accordance with some embodiments of the invention.

Referring to FIG. 1, which illustrates a cross sectional view of an image sensor structure 100 in accordance with some embodiments of the invention. The image sensor structure 100 may be applied to, for example, a BSI (backside illuminated) complementary metal oxide semiconductor (CMOS) image sensor, a charge coupled device (CCD) image sensor or another suitable image sensor. The image sensor structure 100 includes a number of sensing pixels arranged in a matrix. Each sensing pixel has a visible light detection region 1000 for detecting visible light and an infrared light detection region 100IR for detecting infrared light. The visible light detection region 1000 includes a red detection region 100R for detecting incident light in a red color wavelength band, a green detection region 100G for detecting incident light in a green color wavelength band and a blue detection region 100B for detecting incident light in a blue color wavelength band. It is noted that FIG. 1 illustrates only one sensing pixel for facilitating description, and one ordinary skilled in the art is readily known that the cross sectional view of another sensing pixel may be substantially the same as or similar to that shown in FIG. 1. In addition, the red detection region 100R, the green detection region 100G, the blue detection region 100B and the infrared light detection region 100IR may be arranged in a stripe pattern in top view, but the invention is not limited thereto.

The image sensor structure 100 includes a semiconductor substrate 102, photo sensing members 104A-104D, a device layer 106, a carrier substrate 108, an infrared absorption enhancing member 110, an infrared notch filter 112, a color filter 114, an infrared pass filter 116 and microlenses 118. As shown in FIG. 1, the photo sensing members 104A-104D are disposed in the front side 102A of the semiconductor substrate 102 for converting light incident through the back side 102B of the semiconductor substrate 102 into electrons. The photo sensing members 104A-104C are respectively arranged in the red detection region 100R, the blue detection region 100B and the green detection region 100G for detecting red light, blue light and green light, while the photo sensing member 104D is arranged in the infrared light detection region 100IR for detecting infrared light. The photo sensing members 104A-104D may be, for example, photodiodes, pinned photodiodes, photogates, photo transistors, and/or the like.

The device layer 106 is disposed over the front side 102A of the semiconductor substrate 102. The device layer 106 may include dielectric layers and conductive layers for coupling electrical components, such as transistors 106A, conductive lines 106B, vias 106C, and/or the like. The transistors 106A may be configured to collect the electrons generated by the photo sensing members 104A-104D and to convert the collected electrons into voltage signals, and the conductive lines 106B and the vias 106C may be configured to transmit the electrons to, for example, an image processing chip. It is noted that the arrangement of the transistors 106A, the conductive lines 106B and the vias 106C are merely examples. The actual arrangement and configuration of the electrical components in the device layer 106 may be determined depending on design requirements, and are not limited to the illustration shown in FIG. 1.

The carrier substrate 108 is bonded to the device layer 106. In some embodiments, the carrier substrate 108 may be bonded to the device layer 106 by, for example, a direct bonding process, an optical fusion bonding process, or another suitable bonding process.

The infrared absorption enhancing member 110 is disposed in the back side 102B of the semiconductor substrate 102 and in the infrared light detection region 100IR for enhancing the amount of infrared light penetrating into the semiconductor substrate 102 and absorbed by the photo sensing member 104D. The infrared absorption enhancing member 110 may be a convex array structure, a trapezoid array structure, a pyramid array structure, an inversed pyramid array structure, a ridge structure, or any other structure that can enhancing the amount of infrared light penetrating into the semiconductor substrate 102. In some other embodiments, plural absorption enhancing members 110 are disposed in the back side 102B of the semiconductor substrate 102 and in the infrared light detection region 100IR.

The infrared notch filter 112 is disposed over the back side 102B of the semiconductor substrate 102 and in the visible light detection region 100C. In some embodiments, the infrared notch filter 112 is a near-infrared cutoff filter, which may block incident light with a wavelength in a range from about 700 nm to about 1100 nm.

The color filter 114 is disposed over the infrared notch filter 112 and in the visible light detection region 1000. The color filter 114 has a red filter portion 114R, a green filter portion 114G and a blue filter portion 114B, which allows red light, green light and blue light to pass therethrough, respectively.

The infrared pass filter 116 is disposed over the infrared absorption enhancing member 110 and the back side 102B of the semiconductor substrate 102 and in the infrared light detection region 1001R for permitting infrared light to pass therethrough. In some embodiments, the infrared pass filter 116 has a wavelength pass band in a range from 700 nm to 1100 nm for a near-infrared light component to pass therethrough. In certain embodiments, the wavelength pass band of the infrared pass filter 116 has a center pass wavelength of about 850 nm or 940 nm in accordance with various design requirements.

The microlenses 118 are disposed over the color filter 114 and the infrared pass filter 116, and respectively in the red detection region 100R, the blue detection region 100B, the green detection region 100G and the infrared light detection region 1001R. As shown in FIG. 1, each microlens 118 has a convex shape at its light receiving side for focusing incident light. In some embodiments, a further spacer layer (not shown) may be interposed between the color filter 114, the infrared pass filter 116 and the microlenses 118 to keep the microlenses 118 apart from the color filter 114 and the infrared pass filter 116.

Figure 2A:
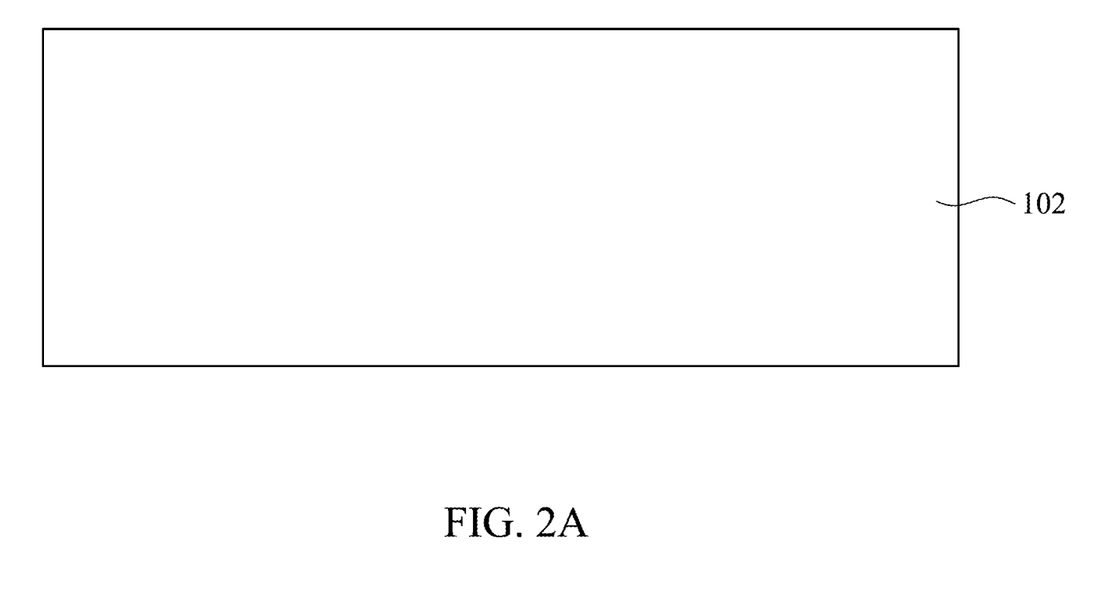
FIGS. 2A-2G illustrate schematic cross-sectional views of intermediate stages illustrating a method of forming an image sensor structure 100 in accordance with some embodiments of the invention.

Referring to FIGS. 2A-2G, which illustrate schematic cross-sectional views of intermediate stages illustrating a method of forming an image sensor structure 100 in accordance with some embodiments of the invention. In FIG. 2A, a semiconductor substrate 102 is provided. The semiconductor substrate 102 be provided including, for example, a semiconductor material of silicon and/or germanium. Another material that is suitable for the formation of the image sensor structure 100 may be included in the semiconductor substrate 102.

Figure 2B:
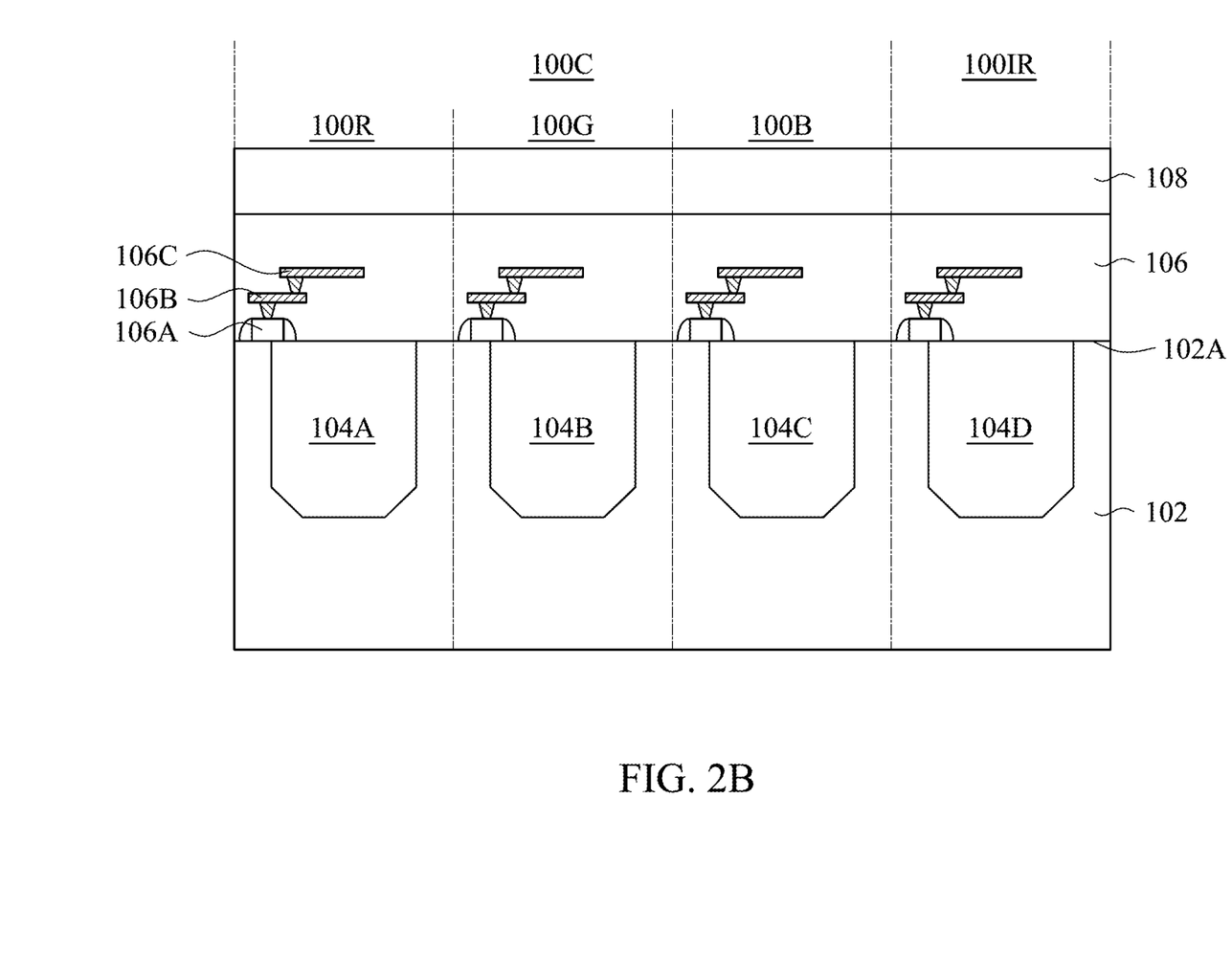

In FIG. 2B, photo sensing members 104A-104D are formed in the front side 102A of the semiconductor substrate 102, a device layer 106 is formed over the photo sensing members 104A-104D and the front side 102A of the semiconductor substrate 102, and then a carrier substrate 108 is bonded to the device layer 106.

In specific, the semiconductor substrate 102 have portions respectively corresponding to a red detection region 100R, a green detection region 100G, a blue detection region 100B and an infrared light detection region 1001R of the image sensor structure 100, and the photo sensing members 104A-104D are respectively disposed in the red detection region 100R, the blue detection region 100B, the green detection region 100G and the infrared light detection region 1001R. The combination of the red detection region 100R, the green detection region 100G and the blue detection region 100B is also referred to as a visible light detection region 1000. The photo sensing members 104A-104D may be formed by an etching process on the semiconductor substrate 102 and then by a following diffusion or implant process, but the invention is not limited thereto. The processes for forming the photo sensing members 104A-104D may be determined depending on design requirements, e.g., the type of the photo sensing members 104A-104D.

The device layer 106 may be formed including transistors 106A respectively coupled with the photo sensing members 104A-104D to collect the electrons generated by the photo sensing members 104A-104D and to convert the collected electrons into voltage signals. The device layer 106 may be formed also including the conductive lines 106B and the vias 106C for transmit the electrons to, for example, an image processing chip. The carrier substrate 108 may be bonded to the device layer 106 by a bonding process, such as a direct bonding process, an optical fusion bonding process or another suitable process.

Figure 2C:
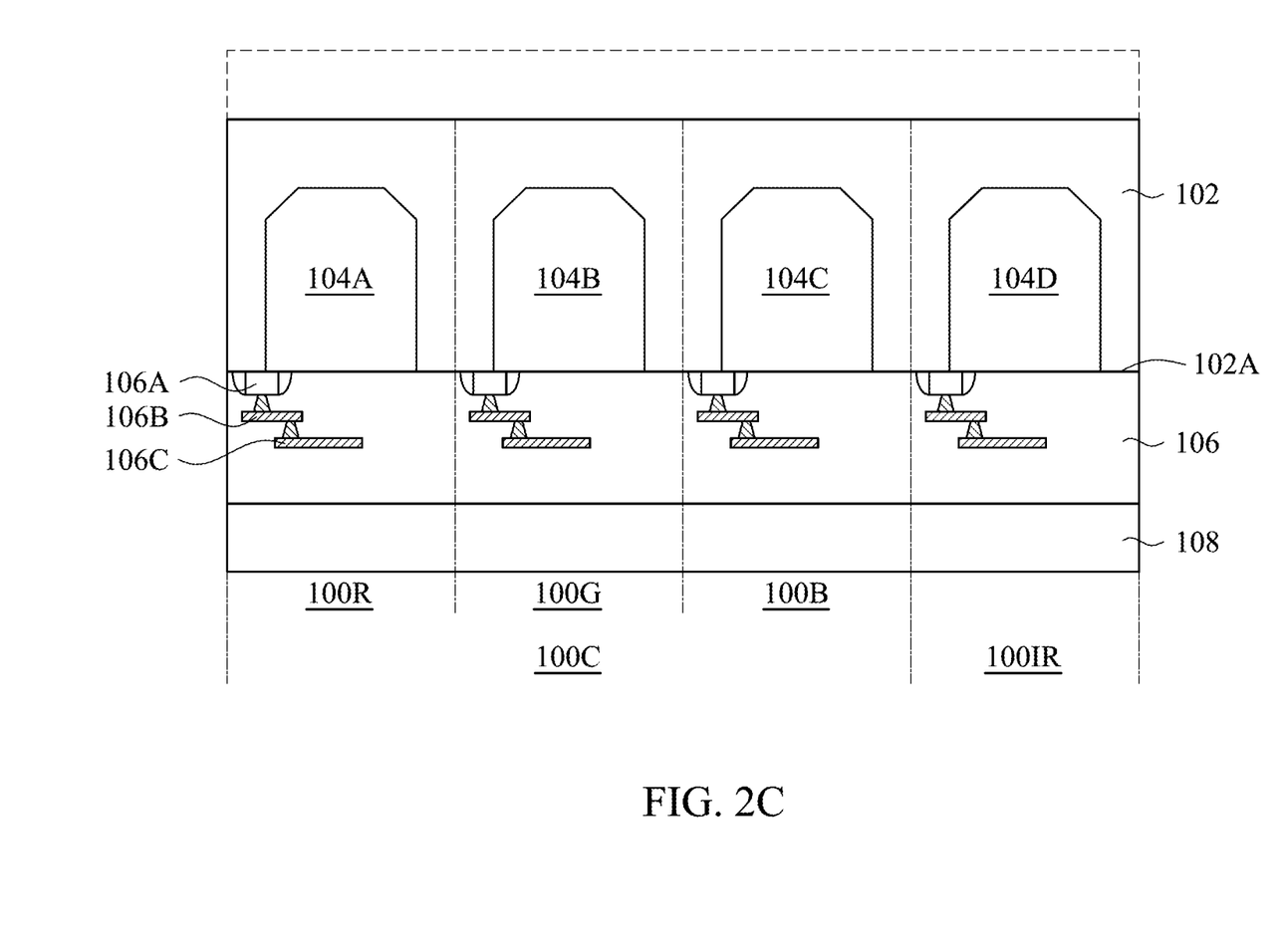

In FIG. 2C, the semiconductor substrate 102 is thinned. In some embodiments, after the carrier substrate 108 is bonded to the device layer 106 first, the structure shown in FIG. 2C is reversed upside down, and then a suitable etching process is performed on the original back side (opposite to the front side 102A) of the semiconductor substrate 102 to thin the semiconductor substrate 102.

Figure 2D:
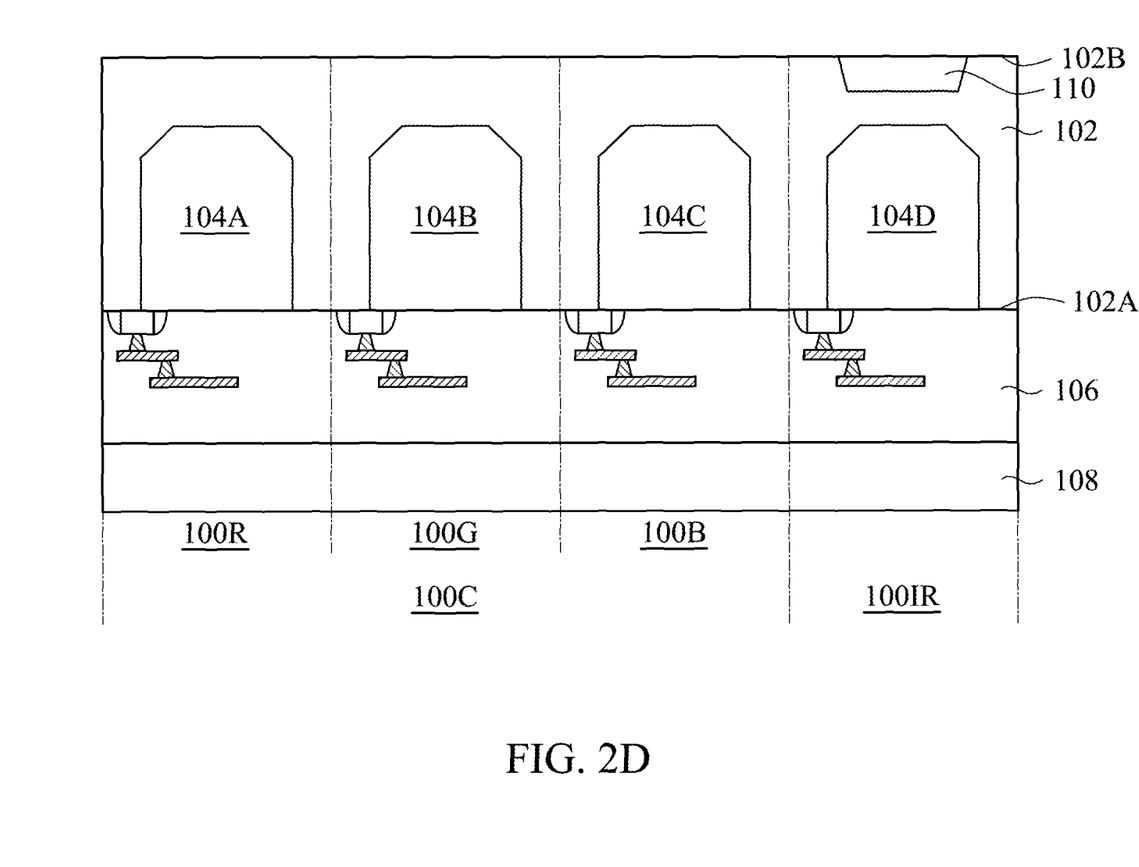

In FIG. 2D, an infrared absorption enhancing member 110 is formed over the back side 102B of the semiconductor substrate 102 and in the infrared light detection region 100IR for enhancing the amount of infrared light penetrating into the semiconductor substrate 102 and absorbed by the photo sensing member 104D. In some embodiments, a patterning process may be performed on the back side 102B of the semiconductor substrate 102 and in the infrared light detection region 100IR to form one or more recesses, and then a deposition process may be performed to fill a material into the recesses to form the infrared absorption enhancing member 110. The material of forming the infrared absorption enhancing member 110 may include, for example, silicon dioxide, hafnium oxide, silicon germanium, a combination thereof, or the like.

Figure 2E:
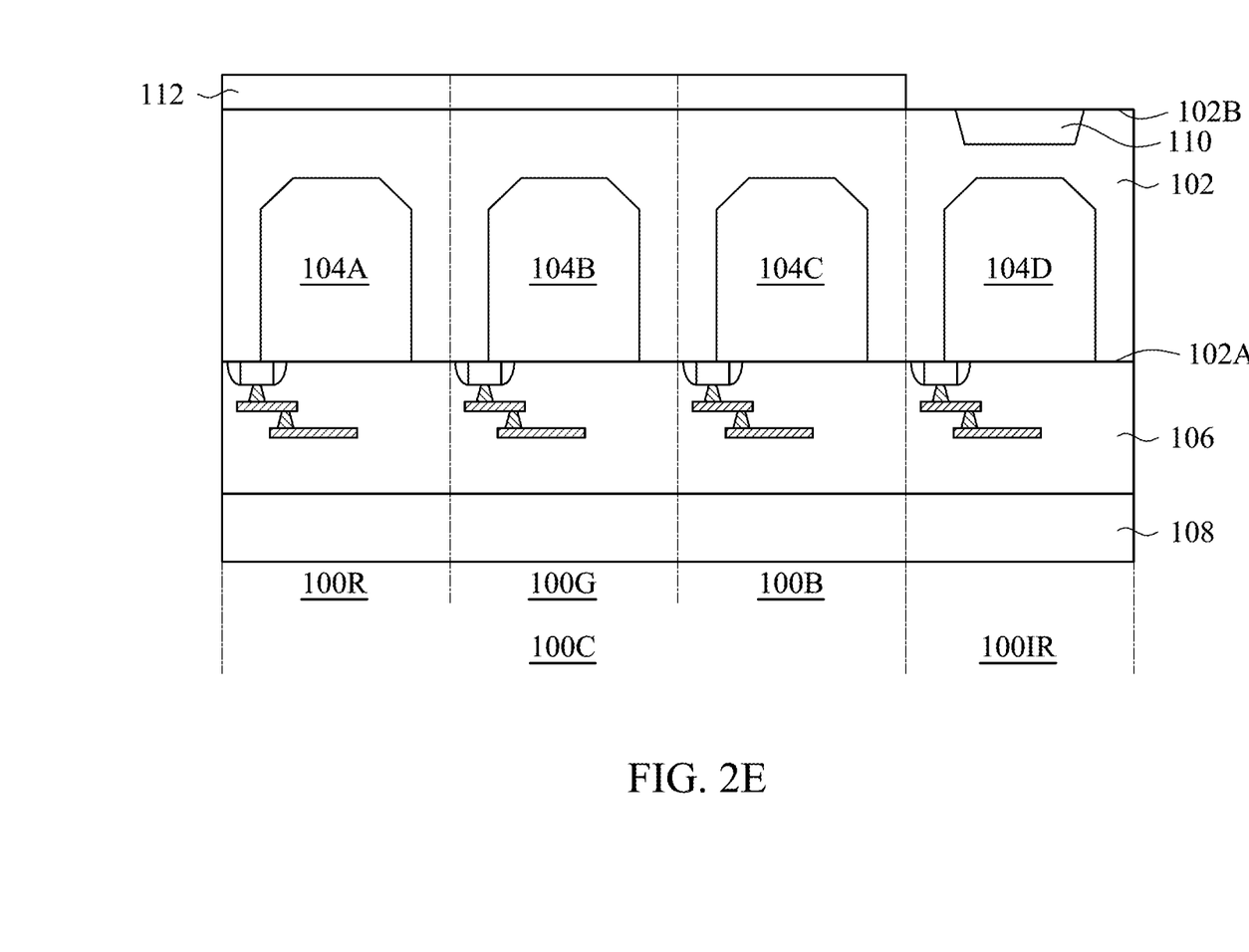

In FIG. 2E, an infrared notch filter 112 is formed over the back side 102B of the semiconductor substrate 102 and in the visible light detection region 100C for cutting off light with a particular infrared wavelength band. The infrared notch filter 112 may be a near infrared cut-off filter formed including an etchable material by utilizing a coating process or another suitable process.

Figure 2F:
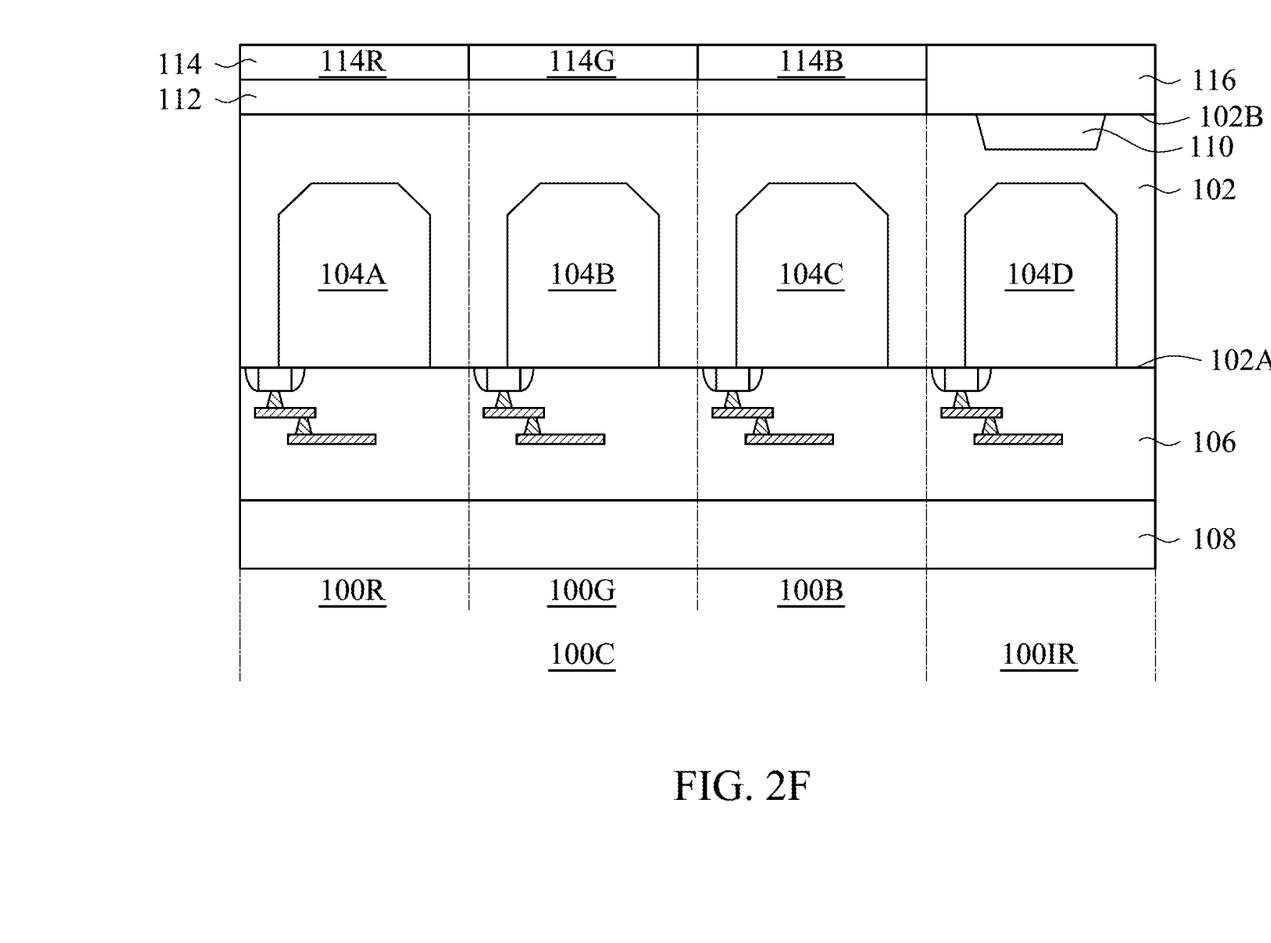

In FIG. 2F, a color filter 114 is formed over the infrared notch filter 112 and in the visible light detection region 1000, and an infrared pass filter 116 is formed over the infrared absorption enhancing member 110 and in the infrared light detection region 1001R.

The color filter 114 and the infrared notch filter 112 are formed for allowing light components in a visible wavelength band to penetrate therethrough and blocking unwanted light components outside of the visible wavelength band. The visible wavelength band of the color filter 114 may include a red light wavelength band, a green light wavelength band and a blue light wavelength band. The color filter 114 has a red filter portion 114R, a green filter portion 114G and a blue filter portion 114B respectively allowing red light component, green light component and blue light component to pass therethrough. The color filter 114 may be formed from a material such as pigment-based polymer, dye-based polymer, resin, and/or another suitable material, and may be formed by, for example, a coating process or another suitable process.

The infrared pass filter 116 is formed for allowing light components in an infrared wavelength band to penetrate therethrough and blocking unwanted light components outside of the infrared wavelength band. The infrared pass filter 116 may be formed including a polymer that passes infrared light components and cuts off visible light components by utilizing a lithographic patterning process or another suitable process. The top surfaces of the color filter 114 and the infrared pass filter 116 may be coplanar in some embodiments.

Figure 2G:
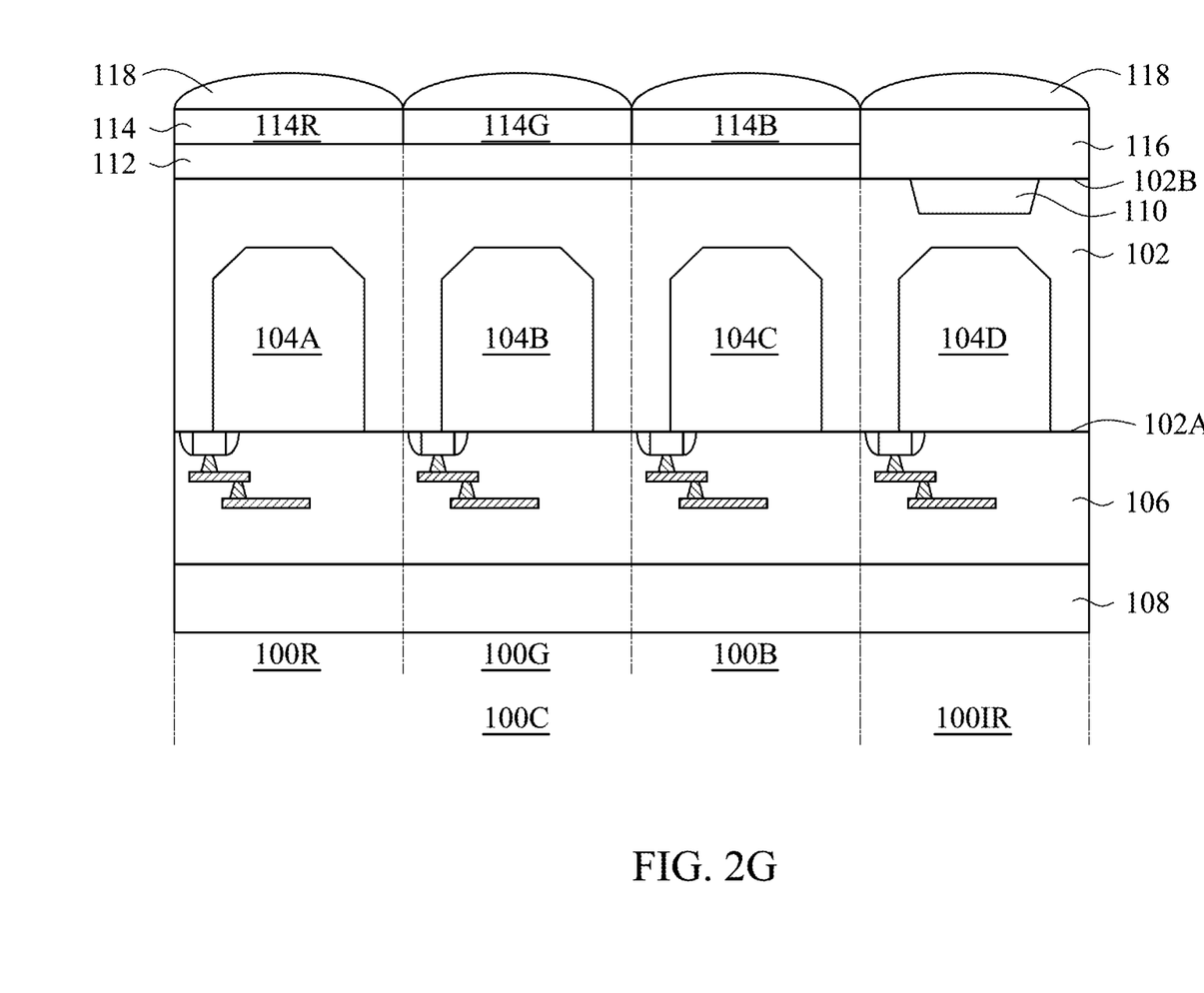

In FIG. 2G, microlenses 118 are formed over the color filter 114 and the infrared pass filter 116, and respectively in the red detection region 100R, the green detection region 100G, the blue detection region 100B and the infrared light detection region 1001R. The microlenses 118 may be formed having a convex shape at its light receiving side for improving light receiving efficiency. The microlenses 118 may be formed from glass, acrylic polymer or another suitable material with high transmittance, and may be formed by a spin-on process, a deposition process, and/or another suitable process.

Figure 3:
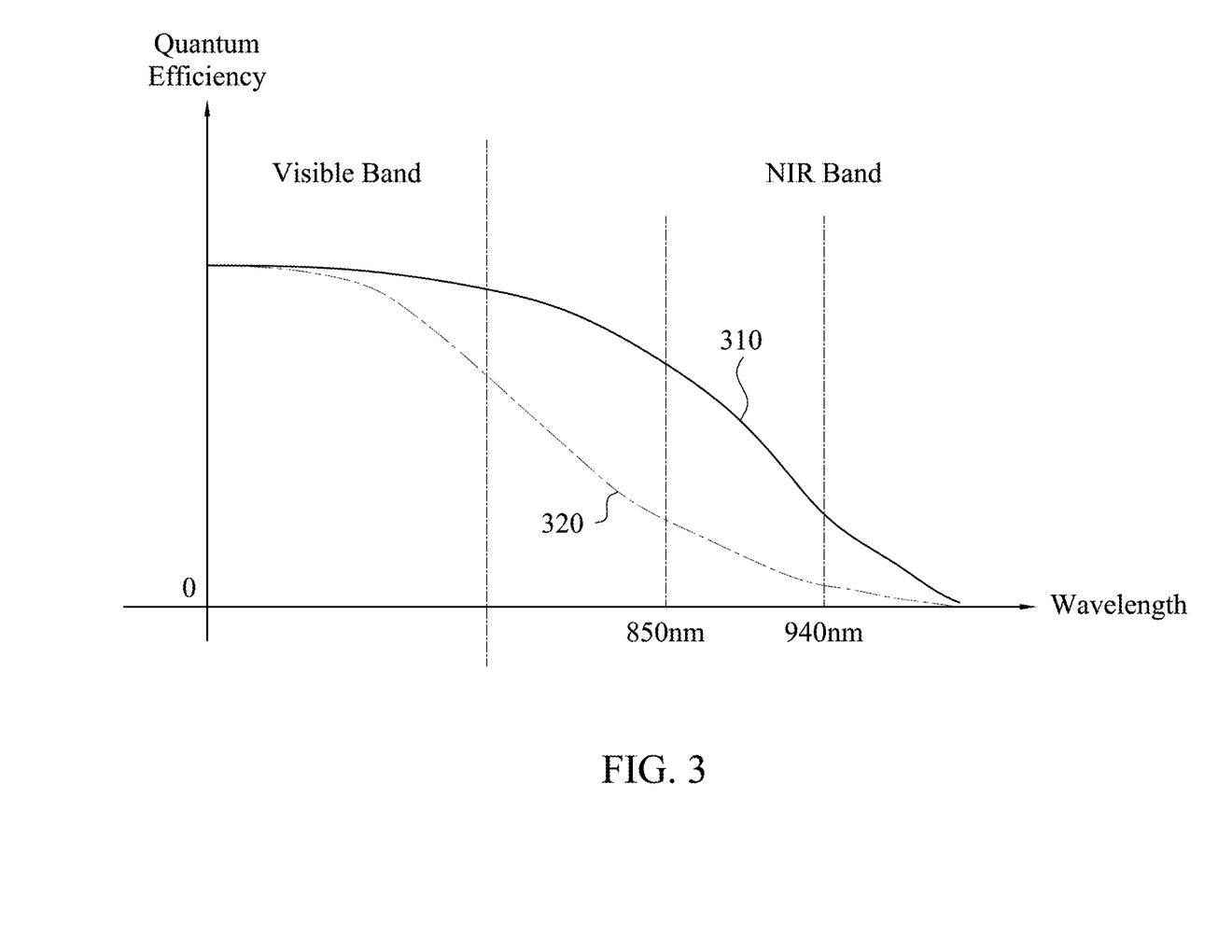
FIG. 3 is a graph showing quantum efficiency (Si device only w/o optical filters) versus wavelength of incident light of the infrared light detection region for the image sensor structure in FIG. 1 and the infrared light detection region for the conventional RGBIR image sensor structure in which no infrared absorption enhancing member is disposed in the light receiving side of the semiconductor substrate.

FIG. 3 is a graph showing quantum efficiency (Si device only w/o optical filters) versus wavelength of incident light of the infrared light detection region 100IR for the image sensor structure 100 in FIG. 1 (curve 310) and the infrared light detection region 100IR for the conventional RGBIR image sensor structure (curve 320) in which no infrared absorption enhancing member is disposed in the light receiving side of the semiconductor substrate. As shown in FIG. 3, in comparison with the conventional RGBIR image sensor structure, the quantum efficiency of the image sensor structure 100 in accordance with the invention in the wavelength band of about 700-1100 nm of the NIR band is significantly improved. In particular, the quantum efficiency of the image sensor structure 100 is improved by about 2-3 times at the wavelength of 850 nm or 940 nm.

Figure 4A:
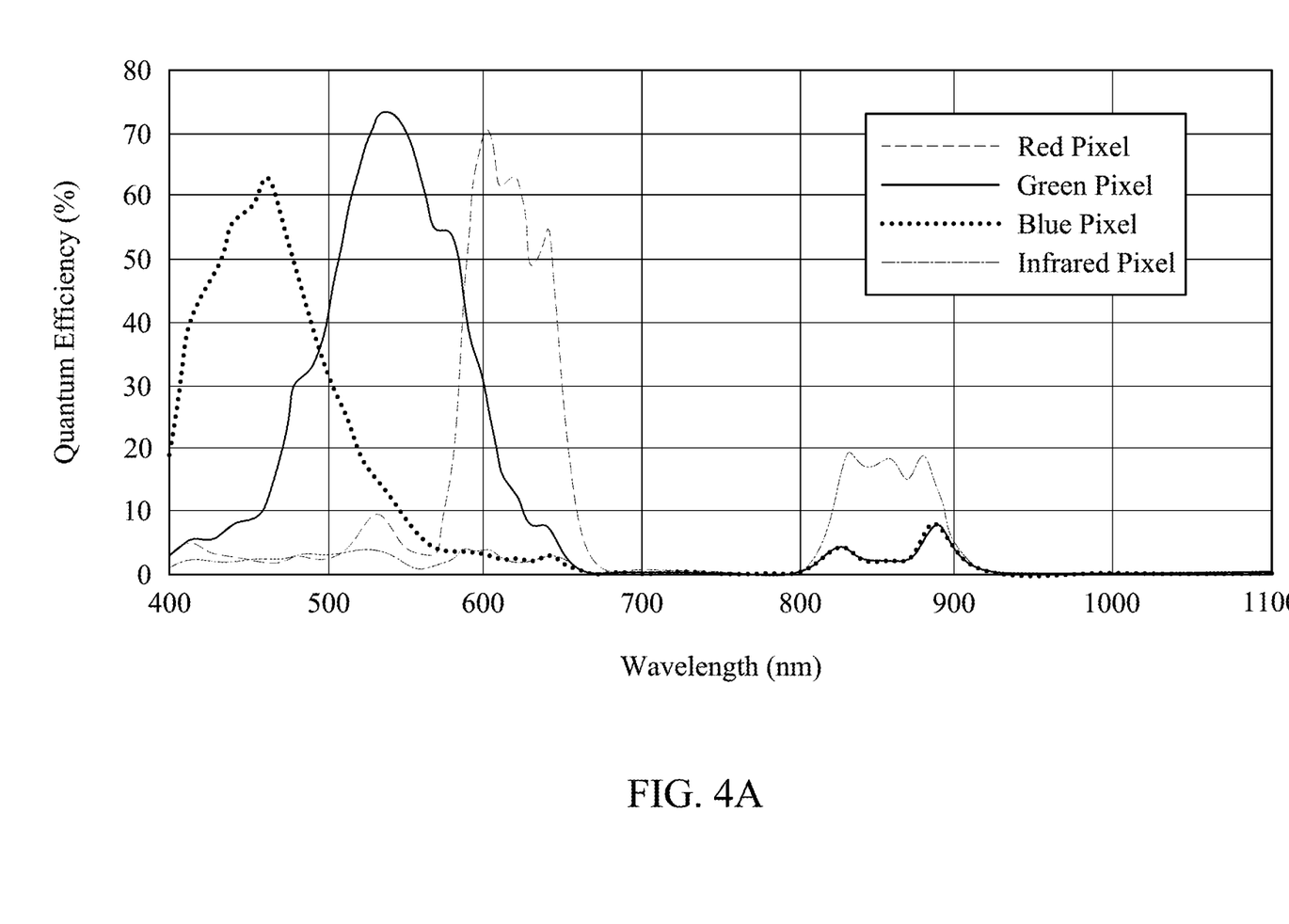
FIG. 4A is a graph showing quantum efficiency versus wavelength of incident light measured in the red pixel, the green pixel, the blue pixel and the infrared pixel of the image sensor structure in FIG. 1 with the infrared notch filter of 850 nm center cutoff wavelength but without the infrared absorption enhancing member.
Figure 4B:
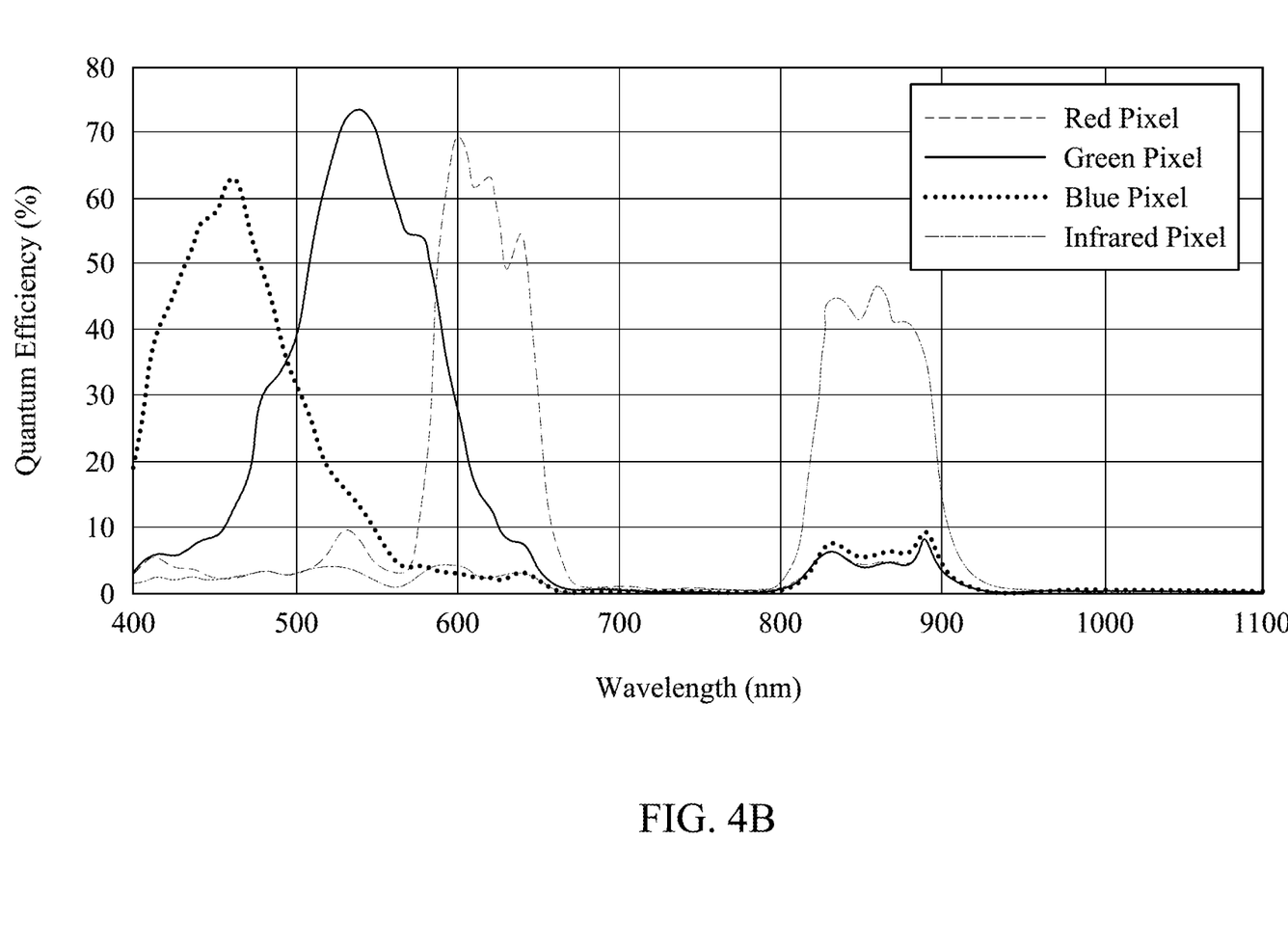
FIG. 4B is a graph showing quantum efficiency versus wavelength of incident light measured in the red pixel, the green pixel, the blue pixel and the infrared pixel of the image sensor structure in FIG. 1 with the infrared notch filter of 850 nm center cutoff wavelength and the infrared absorption enhancing member.

With an additional dual passband optical filter from the lens system, FIG. 4A is a graph showing quantum efficiency versus wavelength of incident light measured in the red pixel (i.e. the red detection region 100R), the green pixel (i.e. the green detection region 100G), the blue pixel (i.e. the blue detection region 100B) and the infrared pixel (i.e. the infrared light detection region 100IR) of the image sensor structure 100 with the infrared notch filter 112 of 850 nm center cutoff wavelength but without the infrared absorption enhancing member 110, and FIG. 4B is a graph showing quantum efficiency versus wavelength of incident light measured in the red pixel, the green pixel, the blue pixel and the infrared pixel of the image sensor structure 100 with the infrared notch filter 112 of 850 nm center cutoff wavelength and the infrared absorption enhancing member 110. By comparing the graphs of FIG. 4A and FIG. 4B, it can be seen that the quantum efficiency of the image sensor structure 100 with the infrared absorption enhancing member 110 within the frequency band of 800-900 nm significantly improved in the infrared pixel, while the quantum efficiency of the image sensor structure 100 with the infrared absorption enhancing member 110 within the visible band (i.e. 400-700 nm) approximately unchanged in the red pixel, the green pixel and the blue pixel. Though the crosstalk of the infrared light component on the red, green and blue pixels is also enhanced, such crosstalk can be canceled by image processing.

Figure 5A:
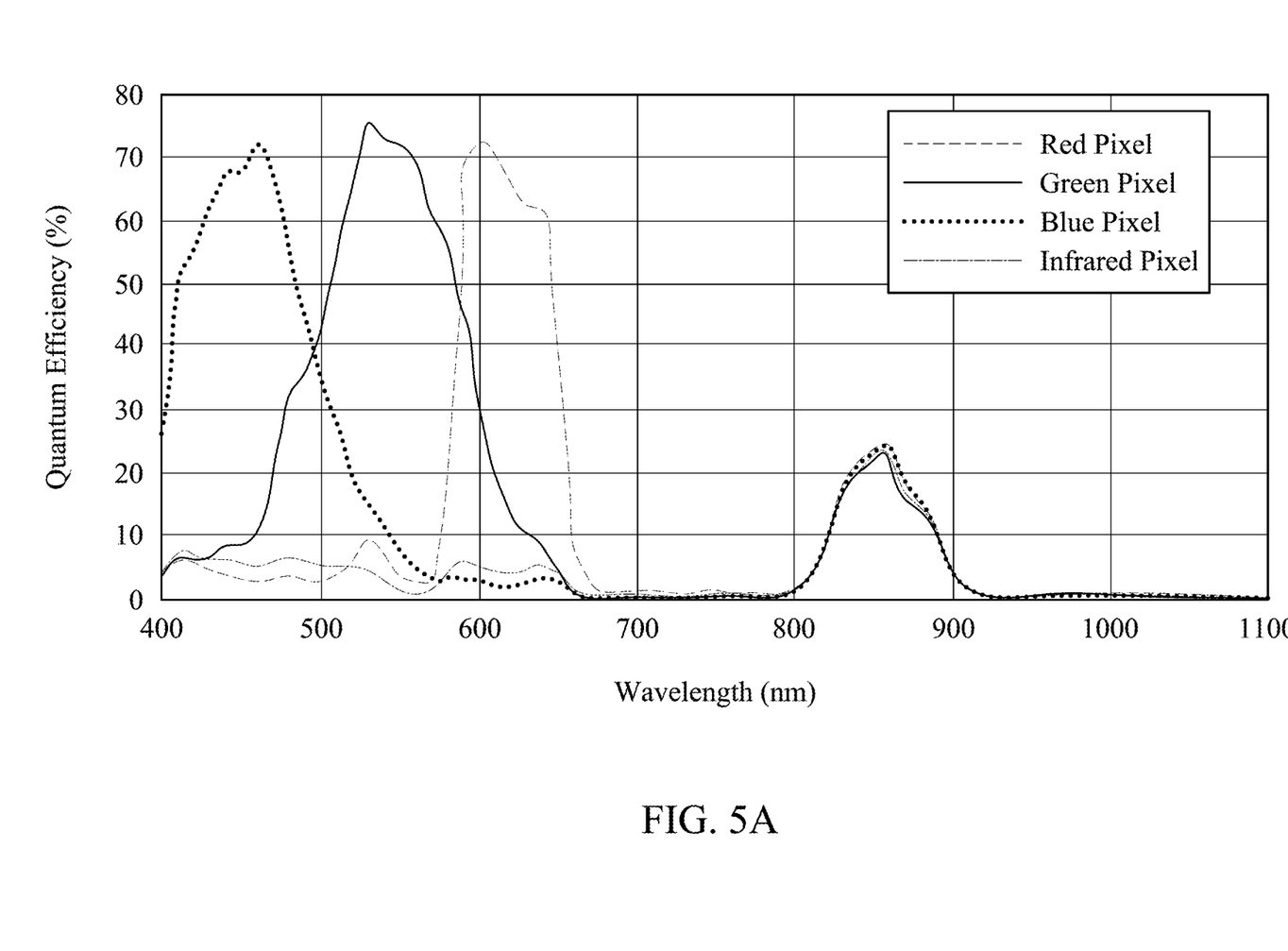
FIG. 5A is a graph showing quantum efficiency versus wavelength of incident light measured in the red pixel, the green pixel, the blue pixel and the infrared pixel of the image sensor structure in FIG. 1 without the infrared notch filter of 850 nm center cutoff wavelength and the infrared absorption enhancing member.
Figure 5B:
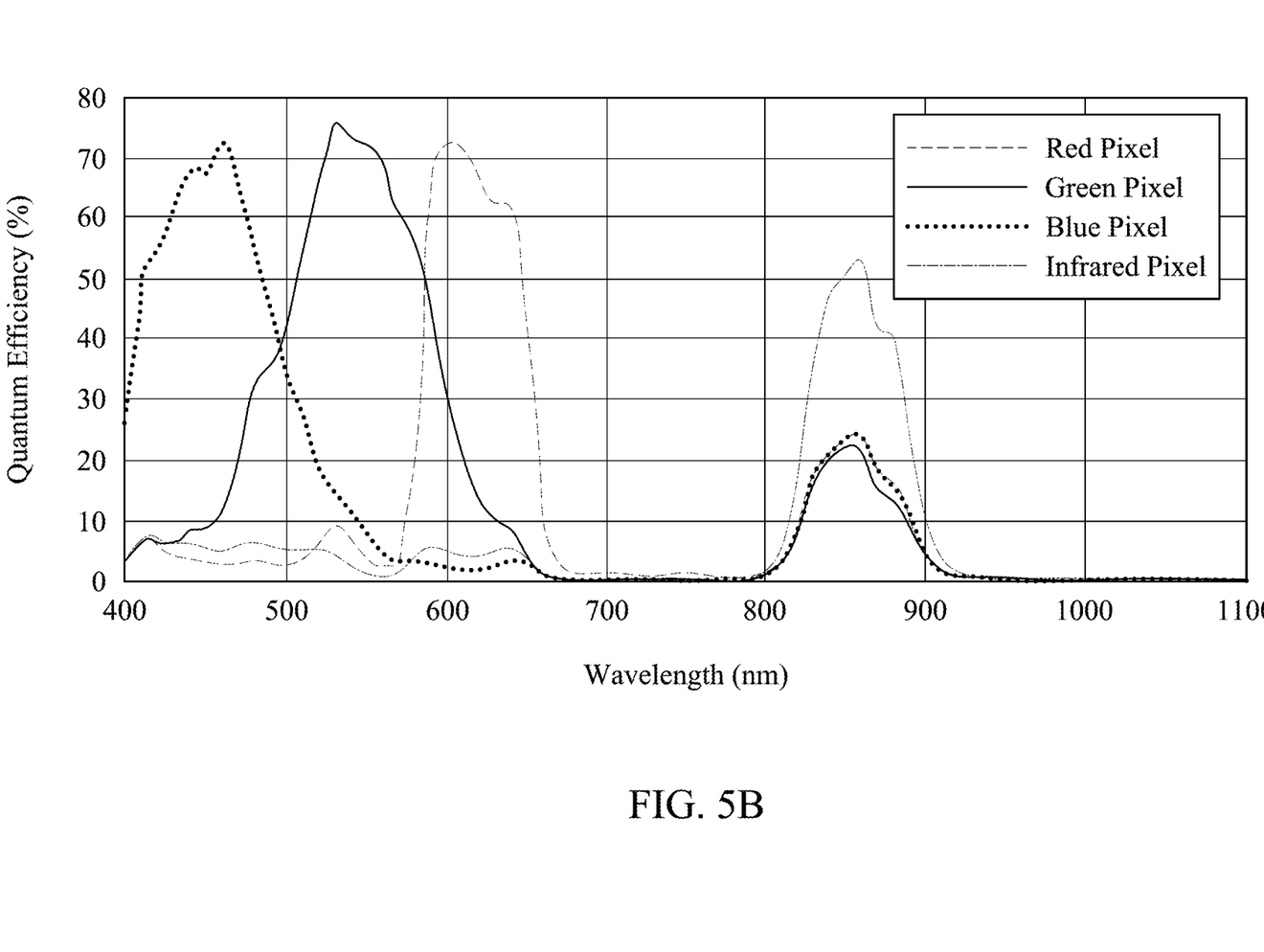
FIG. 5B is a graph showing quantum efficiency versus wavelength of incident light measured in the red pixel, the green pixel, the blue pixel and the infrared pixel of the image sensor structure in FIG. 1 without the infrared notch filter of 850 nm center cutoff wavelength but with the infrared absorption enhancing member.

With an additional dual passband optical filter from the lens system, FIG. 5A is a graph showing quantum efficiency versus wavelength of incident light measured in the red pixel, the green pixel, the blue pixel and the infrared pixel of the image sensor structure 100 without the infrared notch filter 112 of 850 nm center cutoff wavelength and the infrared absorption enhancing member 110, and FIG. 5B is a graph showing quantum efficiency versus wavelength of incident light measured in the red pixel, the green pixel, the blue pixel and the infrared pixel of the image sensor structure 100 without the infrared notch filter 112 of 850 nm center cutoff wavelength but with the infrared absorption enhancing member 110. Similar to the image sensor structure 100 with the infrared notch filter 112, by comparing the graphs of FIG. 5A and FIG. 5B, it can be seen that the quantum efficiency of the image sensor structure 100 with the infrared absorption enhancing member 110 within the wavelength band of 800-900 nm significantly improved in the infrared light detection region 100IR, while the quantum efficiency of the image sensor structure 100 with the infrared absorption enhancing member 110 within the visible band (i.e. 400-700 nm) approximately unchanged in the red detection region 100R, the green detection region 100G and the blue detection region 100B. In addition, with the infrared absorption enhancing member 110, the ratio of the quantum efficiency of the infrared light component in the infrared pixel to the crosstalk of the infrared light component on the red, green and blue pixels is also improved, while the ratio of the quantum efficiency of the visible light component in the red, green and blue pixels to the crosstalk of the visible light component on the infrared pixel approximately remains the same.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims.

What is claimed is:

1. An image sensor structure having a visible light detection region and an infrared light detection region neighboring the visible light detection region, the image sensor structure comprising:
   a semiconductor substrate having a front side and a back side opposite to each other;
   a plurality of photo sensing members disposed in the front side of the semiconductor substrate;
   at least one infrared absorption enhancing member in the back side of the semiconductor substrate and only in the infrared light detection region, the at least one infrared absorption enhancing member arranged for enhancing an amount of infrared light penetrating into the semiconductor substrate and absorbed by one of the photo sensing members in the infrared light detection region;
   a color filter over the back side of the semiconductor substrate and in the visible light detection region; and
   an infrared pass filter over the at least one infrared absorption enhancing member, the infrared pass filter arranged for allowing light components in an infrared wavelength band to penetrate therethrough and blocking unwanted light components outside of the infrared wavelength band.

2. The image sensor structure of claim 1, further comprising:
   an infrared notch filter over the back side of the semiconductor substrate and in the visible light detection region.

3. The image sensor structure of claim 2, wherein the infrared notch filter is interposed between the semiconductor substrate and the color filter.

4. The image sensor structure of claim 1, further comprising:
   a plurality of microlenses respectively over the color filter and the infrared pass filter.

5. The image sensor structure of claim 1, wherein the infrared pass filter has a wavelength pass band in a range from 700 nm to 1100 nm.

6. The image sensor structure of claim 5, wherein the wavelength pass band of the infrared pass filter has a center pass wavelength of about 850 nm.

7. The image sensor structure of claim 5, wherein the wavelength pass band of the infrared pass filter has a center pass wavelength of about 940 nm.

8. The image sensor structure of claim 1, further comprising:
- a device layer over the front side of the semiconductor substrate; and
- a carrier substrate over the device layer.

9. The image sensor structure of claim 1, wherein the at least one infrared absorption enhancing member comprises silicon dioxide.

10. A method of forming an image sensor structure with a visible light detection region and an infrared light detection region neighboring the visible light detection region, the method comprising:
- providing a semiconductor substrate with a front side and a back side opposite to each other;
- forming a plurality of photo sensing members in the front side of the semiconductor substrate;
- forming at least one infrared absorption enhancing member in the back side of the semiconductor substrate and only in the infrared light detection region, the at least one infrared absorption enhancing member arranged for enhancing an amount of infrared light penetrating into the semiconductor substrate;
- forming a color filter over the back side of the semiconductor substrate; and
- forming an infrared pass filter over the at least one infrared absorption enhancing member, the infrared pass filter arranged for allowing light components in an infrared wavelength band to penetrate therethrough and blocking unwanted light components outside of the infrared wavelength band.

11. The method of claim 10, further comprising:
- forming an infrared notch filter over the back side of the semiconductor substrate and in the visible light detection region.

12. The method of claim 11, wherein the color filter is formed over the infrared notch filter.

13. The method of claim 10, further comprising:
- forming a plurality of microlenses respectively over the color filter and the infrared pass filter.

14. The method of claim 10, wherein the infrared pass filter is formed having a wavelength pass band in a range from 700 nm to 1100 nm.

15. The method of claim 14, wherein the wavelength pass band of the infrared pass filter has a center pass wavelength of about 850 nm.

16. The method of claim 14, wherein the wavelength pass band of the infrared pass filter has a center pass wavelength of about 940 nm.

17. The method of claim 10, further comprising:
- forming a device layer over the front side of the semiconductor substrate; and
- forming a carrier substrate over the device layer.

18. The method of claim 10, wherein the at least one infrared absorption enhancing member is formed of silicon dioxide.

\* \* \* \* \*